United States Patent [19]

Blackman et al.

[11] 4,321,615
[45] Mar. 23, 1982

[54] MANUFACTURE OF AN INFRA-RED DETECTOR ELEMENT, AND DETECTION ELEMENTS SO MANUFACTURED

[75] Inventors: Maurice V. Blackman; Michael D. Jenner, both of Southampton, England

[73] Assignee: U.S. Philips Corporation, New York, N.Y.

[21] Appl. No.: 183,524

[22] Filed: Sep. 2, 1980

Related U.S. Application Data

[63] Continuation of Ser. No. 59,875, Jul. 23, 1979, abandoned.

[30] Foreign Application Priority Data

Jul. 31, 1978 [GB] United Kingdom ............... 31749/78

[51] Int. Cl.$^3$ ..................... H01L 31/02; C23C 15/00; H01L 31/18
[52] U.S. Cl. ...................................... 357/30; 156/643; 204/192 E; 29/572; 250/211 R; 250/338
[58] Field of Search ........................ 204/192 E, 192 P; 156/643; 357/30; 29/572; 250/338, 211 R, 211 J

[56] References Cited

U.S. PATENT DOCUMENTS 3,989,946 11/1976 Chapman et al. ............... 250/332
4,029,962 6/1977 Chapman .......................... 250/338
4,128,467 12/1978 Fischer ........................... 204/192 E
4,258,254 3/1981 Elliott ............................. 250/211 J Primary Examiner—Aaron Weisstuch
Attorney, Agent, or Firm—Jack E. Haken

[57] ABSTRACT

The manufacture of an infra-red radiation detector element (51). A body of infra-red sensitive material (e.g. cadmium mercury telluride) secured to a substrate (22) is subjected to ion-etching to remove part of the material over the whole thickness of the element (51) at areas (56) between the contact areas of the element electrodes (35 and 36b) so as to define a current path between these electrodes (35 and 36b) which extends through the remaining material and is longer than the distance along a straight line between the electrodes (35 and 36b). This longer current path increases the charge-carrier transit time and resistance between the electrodes (35 and 36b) so that the responsivity of the detector element (51) can be improved while still producing a compact element structure because of the advantages of defining the current path by ion-etching. This etch-removal may involve forming parallel slots (56) which extend from opposite side walls of the element (51) to define a meandering current path, and may additionally be used to form a mutual separation (55) between portions (51 and 52) of the body each of which is to form a separate infra-red detector element of an array formed on the substrate (22).

75 Claims, 19 Drawing Figures

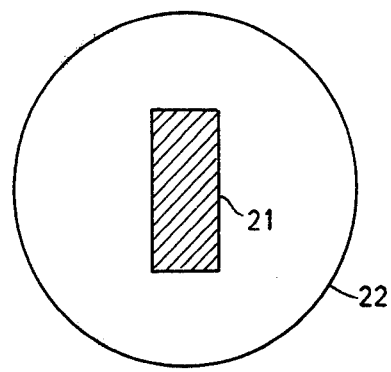
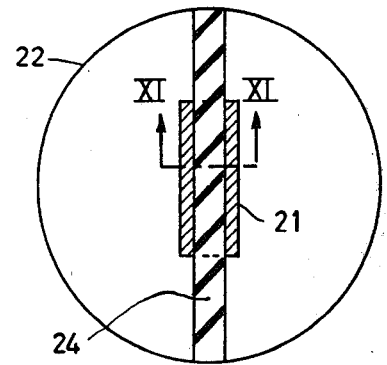
FIG. 9  FIG. 10
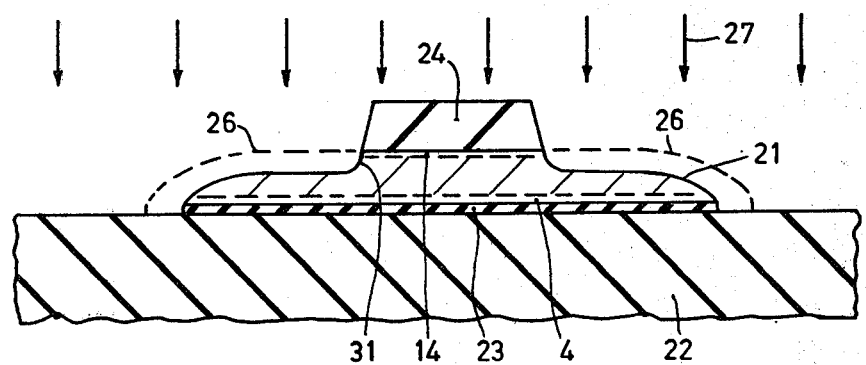
FIG. 11
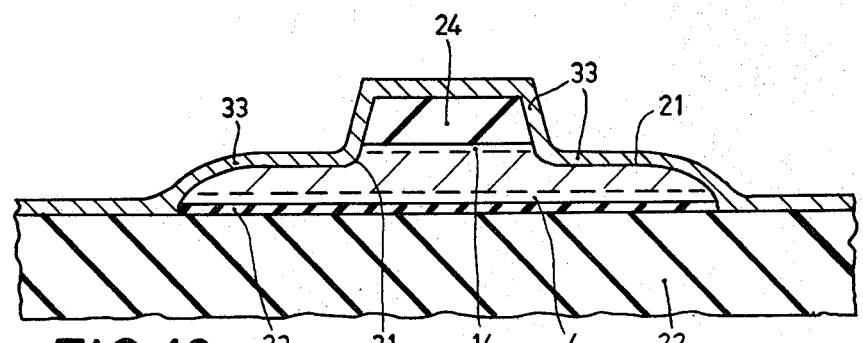
FIG. 12

MANUFACTURE OF AN INFRA-RED DETECTOR ELEMENT, AND DETECTION ELEMENTS SO MANUFACTURED

This is a continuation, of application Ser. No. 059,875, filed July 23, 1979 now abandoned.

The invention relates to methods of manufacturing an infra-red detector element, particularly but not exclusively of cadmium mercury telluride, and further relates to infra-red detector elements manufactured by such methods.

U.S. Pat. No. 4073969 discloses a method of manufacturing a detector element for infra-red radiation comprising an active area of infra-red sensitive material between two separate electrodes each on a contact area of the material; in this method steps are performed to reduce loss in responsivity of the detector element due to recombination of the radiation-generated charge carriers from said active area at one of said contact areas.

This loss in responsivity results from a phenomenon called "sweep-out". The responsivity in proportional to the time the radiation-generated carriers spend in the infra-red sensitive material. The electrodes at the contact areas act as regions of intense recombination of these radiation-generated carriers. The carrier lifetime is a measure of the time a minority carrier can spend in the infra-red sensitive material before recombining therein with majority carriers. If before this recombination occurs in the material, the minority carriers reach the contact area to which they are travelling, a part of their useful life in radiation detection is lost and they are said to have been swept out by the electrode. Thus, the electrode is draining away these minority carriers faster than they would normally recombine if contacts were not present.

The steps disclosed in said United States patent to reduce this loss of responsivity consist of shielding part of the detector active area to retain a reduced active area sufficiently spaced from one of the contact areas to permit negligible loss in responsivity due to recombination at that contact area. However a disadvantage of this technique is that for a given body size the active area is reduced and the shielded part occupies a significant space which is not sensitive to the radiation; this space occurs over the whole width of the detector element, between the contact area and the reduced active area. Thus, it can be difficult to obtain an array of such detector elements having a maximum radiation-sensitive area with the individual active areas as close as possible to each other to minimize the non-sensitive areas therebetween.

According to the present invention a method of manufacturing a detector element for infra-red radiation, comprising an active area of infra-red sensitive material between two separate electrodes each on a contact area of the material, in which steps are performed to reduce loss in responsivity of the detector element due to recombination of radiation-generated charge carriers from said active area at one of said contact areas, is characterized in that said steps comprise securing to a substrate a body of said material from which said detector element is formed, and using ion-etching to remove part of said material from between where the contact areas are to be or are formed, said ion-etching being effected over the whole thickness of the body and across part of its width so as to define a meandering current path in the active area between the contact areas, which current path extends through the remaining infra-red sensitive material in said active area and is longer than the distance along a straight line between the contact areas.

The meandering current path (and hence the element structure) can be very compact because of the advantages of using ion-etching to remove the material to define the current path. Because of this meandering current path many of the radiation-generated charge carriers near the one contact area cannot travel in a straight line to said contact area but must travel along a longer path so increasing their transit time in the infra-red sensitive material and reducing the loss in detector responsivity caused by recombination at the electrode at that contact area. The longer current path which meanders one or more times increases not only the charge-carrier transit time but also the resistance between the electrodes. Because the responsivity is proportional to both the transit time and the resistance, this increase in resistance further increases the responsivity of the detector element.

Furthermore, in devices in accordance with the invention, the active area of the detector element can extend right up to the contact areas, and the outside dimensions of the general area which is between the contact areas and within which the meandering current path is formed in the active area need not be smaller than that of a detector element without the meandering current path. Thus such detector elements manufactured in accordance with the invention can provide a closely-spaced array of active areas on the substrate.

Ion etching is a known process by which a surface is eroded by bombardment with high energy particles obtained by accelerating ionized atoms or molecules, at least some of which may be neutralised with electrons before reaching the surface. Ion energies of a few hundred to several thousand eV are generally used.

The Applicants have found that by using such energies, unmasked parts of bodies of infra-red sensitive material such as, for example, cadmium mercury telluride can be readily etched in a reproducible manner throughout their thickness while the effect on the resulting body surface need not significantly increase the low frequency (1/f) noise or reduce the detectivity (D*). Steep side-walls can be formed by such ion-etching with at most only small lateral etching occurring below the edge of the etchant mask. Thus, the ion-etching permits very narrow parts of the body to be removed so as to define the longer current path between the contact areas; the width of the narrow parts removed may be for example approximately equal to or less than the thickness of said body, and gaps as small as for example 10 microns and less can be obtained in this way. Thus, using ion-etching to form such a longer current path has a considerable advantage over the use of chemical etchant solutions which would etch the body laterally as well as vertically; in that case which is not in accordance with the present invention the width of the resulting gaps would be much larger than either the thickness of the body or the width of the etchant masking layer window. In general, it is desirable to reduce the width of such gaps because they constitute non-sensitive areas which penetrate the infra-red sensitive active area of the element between its electrodes.

A meandering current path between the contact areas can be formed comparatively easily in accordance with the invention when said ion-etching over the whole thickness of the body forms a plurality of substantially parallel slots which extend from opposite side walls of the element.

A further advantage of ion-etching is that it may be effected after providing a passivating layer at least on the body surface between the contact areas and/or after providing electrode metallization at least on the contact areas, because such etching can also remove parts of the passivating layer and electrode metallization if so desired.

Thus, the ion-etching may be used to remove parts of such a passivating layer before removing underlying material over the whole thickness of the body. Because such etching can be effected without significant lateral etching of the passivating layer below the mask used, the upper surface of the active area between the contact areas can remain covered by the remaining parts of said passivating layer even after forming a quite narrow current path by the material removal.

The ion-etching may remove electrode metallization parts from the body and/or the substrate to define the required electrode pattern for the detector element. Overlying parts of the metallization pattern may be removed by the ion-etching before removing underlying material over the whole thickness of the body. This can facilitate manufacture of the detector element and is especially useful for increasing manufacturing tolerances in aligning the desired ion-etching pattern with the desired contact pattern. For the same reasons it is usually preferable for the ion-etching to form adjacent at least one contact area a slot which extends across part of the width of said active area. Thus an element structure can be formed in which the part of the active area adjacent the contact area where sweep-out occurs is reduced and the meandering current path adjoins this contact area over only part of the width of said active area. In order to facilitate manufacture and retain as much infra-red sensitive material as possible between the contact areas, it is preferable for such a slot adjacent the contact area(s) to be etched at least partially through part of the electrode metallization, thereby removing a non-sensitive portion of the detector element.

Parts of the electrode metallization may be removed by the ion-etching so as to divide the metallization into separate electrodes.

The ion-etching step over the whole thickness of the body may additionally be used to form a mutual separation between portions of the body, each of which is to form a separate infra-red detector element having its own contact areas and electrodes. Thus by merely changing the pattern of the masking layer used during the ion-etching and by starting with an appropriately sized body, a group of detector elements can be formed by the same processing steps.

In order to illustrate the realisation of these and other features in accordance with the invention and their advantages, embodiments of the invention will now be described, by way of example, with reference to the accompanying diagrammatic drawings, in which:

FIG. 9 is a plan view of one such body mounted on a detector substrate in a subsequent step of the manufacture;

FIG. 10 is a plan view of the arrangement of FIG. 9 after providing a first masking layer;

FIG. 11 is a cross-sectional view taken on the line XI—XI of FIG. 10 after forming a mesa at the body surface by ion-beam etching;

FIG. 12 is a cross-sectional view of the arrangement shown in FIG. 11 after a metal deposition step;

Figure 1:
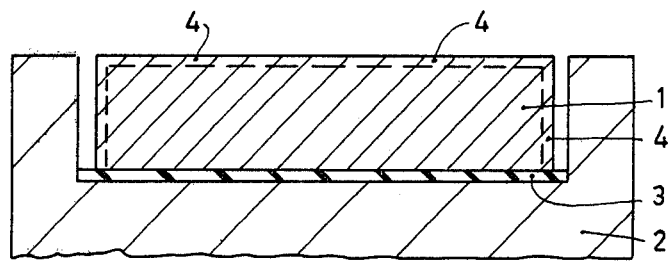
FIG. 1 is a cross-sectional view of a wafer of cadmium mercury telluride mounted on a polishing block at an early stage in the manufacture of an infra-red detector element by a method in accordance with the invention.

It should be noted that the Figures in the accompanying drawings are not drawn to scale; the relative dimensions and proportions of some parts of the Figures have been greatly exaggerated or reduced for the sake of clarity. In particular, the thickness of the various layers in relation to their lateral extent is much smaller than may otherwise be apparent from the drawings. The same reference numerals as used in one Figure are generally used to refer to the same or similar parts in other Figures and embodiments.

In the method now to be described with reference to FIGS. 1 to 17, the starting material is a crystal wafer 1 of cadmium mercury telluride, $Cd_{1-x}Hg_xTe$ where $0<x<1$. The material is sensitive to infra-red radiation, and the atomic ratio of cadmium to mercury may be such as to produce a cut-off wavelength for the material of for example approximately 12 microns. The dimensions of the starting wafer are not critical but should be sufficient to provide the large number of detector elements to be manufactured therefrom, for example over a thousand elements; the wafer may be circular with a diameter of for example 10 m.m.; its thickness may be for example 0.5 m.m.

The wafer 1 is mounted on a polishing block 2, for example by a layer of wax 3. The thickness of the wafer 1 projecting above shoulders of the block 2 is then lapped away and its exposed major surface is polished in known manner. The resulting wafer thickness may now be for example 200 microns. Preferably the final polishing stage involves a chemical etching treatment to remove surface damage. The polished surfaces and the side of the wafer 1 are now provided with a passivating layer 4, for example by anodic oxidation in known manner. The resulting arrangement is illustrated in FIG. 1.

Figure 2:
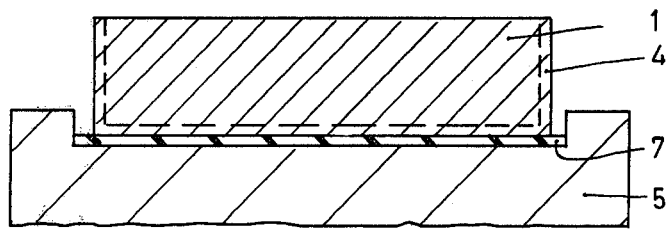
FIG. 2 is a cross-sectional view of the wafer mounted on another polishing block at a subsequent step in the method.
Figure 3:
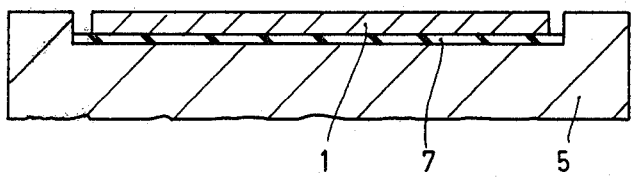
FIG. 3 is a cross-sectional view of the wafer after thinning on said other polishing block.

The wafer 1 is now removed from the block 2 and adhered via its anodized major surface to another polishing block 5, for example with a layer of wax 7. Although the passivating layer 4 is shown in FIGS. 1 and 2, it is omitted in subsequent Figures for the sake of convenience. The thickness of the wafer 1 projecting above shoulders of the block 5 is then lapped away and its exposed major surface is polished in known manner. The resulting wafer thickness may now be for example 15 microns. The resulting arrangement is illustrated in FIG. 3.

Figure 4:
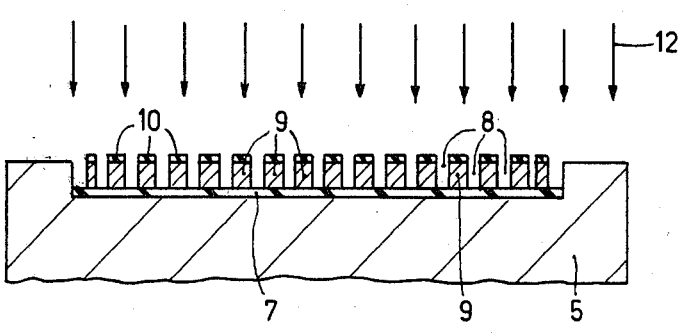
FIG. 4 is a cross-sectional view of the thinned wafer on said other polishing block at a subsequent ion-beam etching step for forming strip portions from the wafer.
Figure 5:
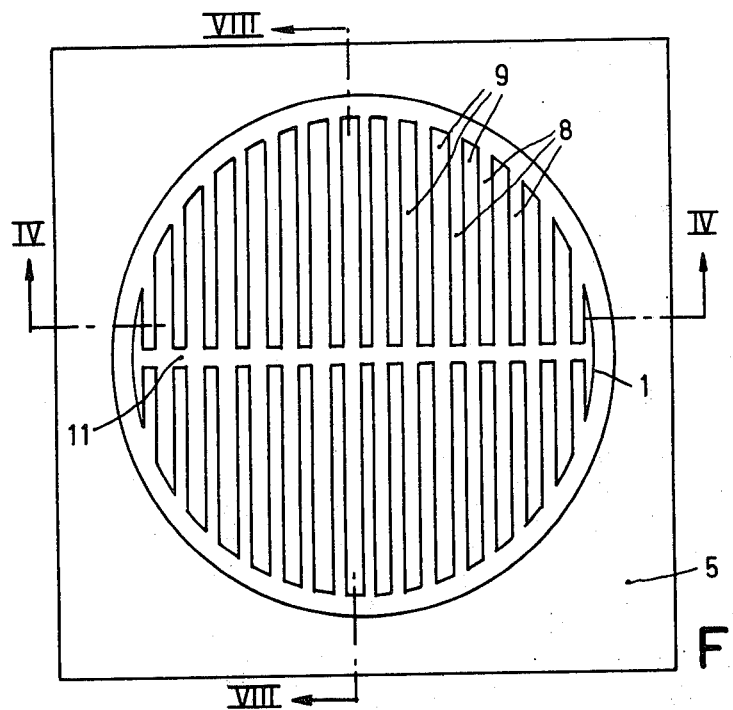
FIG. 5 is a plan view of the thinned wafer on said other polishing block after the ion-beam etching step, the cross-section of FIG. 4 being taken along the line IV—IV of FIG. 5.
Figure 7:
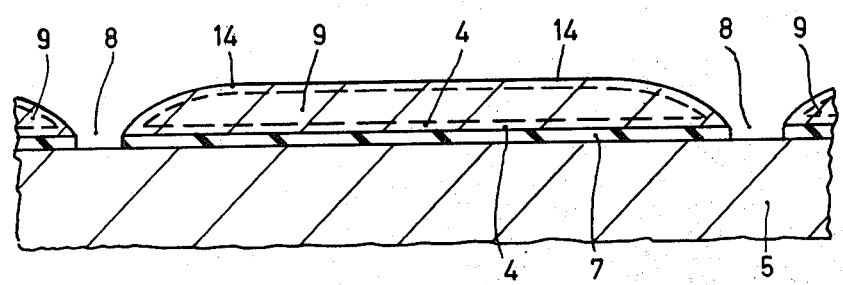
FIG. 7 is a cross-sectional view of parts of three of the strip portions of the wafer after a subsequent anodising treatment.

A layer of photoresist is then provided on the thinned wafer 1 and is selectively exposed and developed to provide a photoresist masking layer 10. The pattern of the layer 10 corresponds to the pattern of interconnected strip portions 9 illustrated in FIG. 5. The photoresist may be for example that commercially available under the trade name Shipley resist AZ 1350H of Shipley Chemicals Limited. An etching treatment is then effected using the layer 10 as an etchant mask so as to form a plurality of slots 8 through the thickness of the wafer 1. As shown in FIGS. 4 and 5, the slots 8 define substantially parallel strip portions 9 of the wafer which are interconnected by an orthogonal strip 11 extending across a diameter of the wafer.

As illustrated in FIG. 4, this etching treatment may be performed by a beam 12 of, for example, argon ions. Such etching is effected in a vacuum chamber with the wafer and block arrangement 1, 5 mounted on a target holder; the target holder may be for example water-cooled and rotatable during the etching treatment. The pressure in the chamber is kept sufficiently low that scattering of the ions is minimal and the surface to be etched is bombarded by the ions at a predetermined angle. The incident ion-beam is obtained from an ion source which may be mounted, for example, at the top of the chamber. The Applicants have used a chamber with a saddle-field ion source commercially available from Iontech Limited of Teddington, U.K. Using this ion source, the etching area at a target distance of 5 cm. is found to be 2 sq.cm., and the argon ion current can be up to 45 micro Amps plus an approximately equivalent dose of neutral argon atoms using a voltage of 5 kV with a source current of 1 mA and an argon pressure of $5 \times 10^{-4}$ torr.

The etch rate depends on the beam current, the incident angle of the beam, the energy of the beam and the nature of the target material. The incident angle can be varied by tilting the target holder. For use at different stages of this method of manufacture, the target holder may be at a distance of, for example, 4 cm. from the ion source with an incident beam which may be perpendicular to the surface or inclined at an angle of up to, for example, 45°; under these conditions the Applicants have etched cadmium mercury telluride at a rate of approximately 4 microns an hour. The etch rate of the Shipley resist was found to be between 0.1 and 0.3 times that of the cadmium mercury telluride. Therefore approximately 4 hours are needed to etch the slots 8 through the 15 micron thickness of the wafer 1. A typical thickness for the layer 10 is 5 to 7.5 microns. By ion-beam etching in this manner the Applicants have found that steep side walls having a slope of for example 75° can be achieved. In this way narrow slots 8 can be formed in the wafer 1 so that a large proportion of the wafer can be used to provide the detector elements. The remaining strip portions 9 may be for example 200 microns wide, and the slots 8 may be for example 10 microns wide etched through 10 micron wide windows in the masking layer 10. Although FIG. 5 shows only fourteen such strip portions 9 across the diameter of the wafer it should be understood that there are actually many more present.

Figure 6:
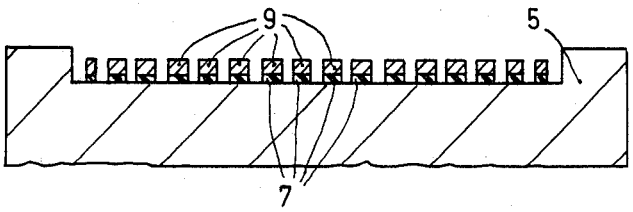
FIG. 6 is a cross-sectional view taken along the same line as FIG. 4 after a thinning and rounding step.

In the next stage of manufacture, the part of the photoresist layer 10 remaining on the strip portions 9 is removed, after which the thickness of the strip portions 9 is reduced to for example 10 microns while rounding their exposed longitudinal upper edges. This thickness reduction and rounding may be effected by polishing and etching in a manner such as that described in U.S. Pat. No. 4,037,311. FIG. 6 shows in cross-section the strip portions 9 after the etching process; due to the distortion of the relative dimensions of the drawing the rounding of the longitudinal edges is not apparent in this Figure, but it is illustrated in the close-up view of FIG. 7. It should also be noted tha the wax layer parts exposed by the slots 8 are removed during the etching of the slots 8 and during the subsequent thinning and rounding treatment.

The exposed upper surface of the strip portions 9 and their side walls are now provided with a passivating layer 14, for example by anodically oxidizing the cadmium mercury telluride surface in known manner. The strip portion 11 serves to interconnect the strip portions 9 during such an anodizing treatment. Both the passivating layers 4 and 14 are illustrated in the close-up cross-sectional view of one such strip portion 9 shown in FIG. 7.

Figure 8:
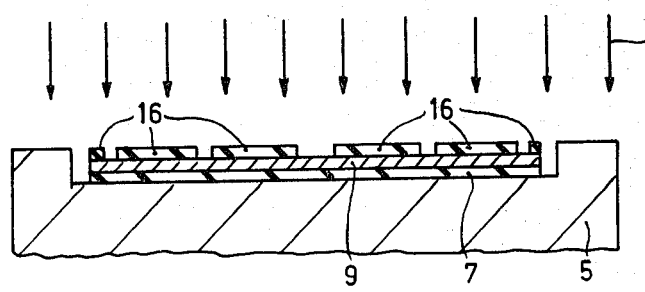
FIG. 8 is a cross-sectional view along the line VIII—VIII of FIG. 5 illustrating the division of a strip portion of the wafer into separate bodies during a further ion-beam etching step.

A further layer of photoresist is then provided and is selectively exposed and developed to form a masking layer 16 having a pattern for dividing the strip portions 9 along their length into a plurality of separate bodies 21 of infra-red sensitive material. This is effected by etching through the thickness of the portions 9 so as to form slots which extend perpendicular to the slots 8. This etching step also may be effected in a manner similar to that described with reference to FIG. 4 by using a beam 17 of argon ions. This step is illustrated in FIG. 8. The length of each body 21 formed from the strip portions 9 in this embodiment is sufficient to provide a linear array of two detector elements as will now be described with reference to FIGS. 9 to 17. The bodies 21 may thus have for example a length of 125 microns, a width of 200 microns and a thickness of 10 microns.

A body 21 is removed from the polishing block 5 and is mounted on an area of a surface of an insulating substrate 22. The surface of the body 21 passivated by the layer 4 is secured to the surface of the substrate 22, for example by a thin adhesive layer 23 which is illustrated in the cross-sectional views of FIGS. 11, 12 and 15. The substrate 22 may be of optically-polished sapphire. The body 21 is shaded in FIG. 9 for the sake of clarity.

Next a layer of photoresist is provided over the surface of the substrate 22 and body 21, and is selectively exposed and developed to form a first photoresist masking layer 24 on a part of the upper surface of both the body 21 and the substrate 22. The layer 24 consists of a stripe of photoresist which is shown shaded in FIG. 10. The stripe 24 extends locally across the body 21 in a direction substantially perpendicular to those along which the body 21 will subsequently be divided into the desired linear array. The stripe 24 is present on the passivating layer 14 on the body surface where the underlying masked area defines the passivated active area of the detector element; in this active area the infra-red radiation is to be sensed. The stripe 24 may be for example 50 microns wide. The areas not masked by the stripe 24 are subsequently provided with a metallization pattern as will be described hereinafter. The stripe 24 determines a separation in the metallization pattern on the body 21 and extends onto the substrate 22 to also separate parts of the metallization pattern where subsequently formed on the substrate 22.

Before depositing metal for said metallization pattern, a mesa is formed at the body surface by ion-beam etching. This is illustrated in FIG. 11. While using the stripe 24 as an etchant mask the exposed part of the passivating layer 14 and an underlying portion of the infra-red sensitive material is removed by bombardment with a beam 27 of for example argon ions. The etching conditions may be similar to those described previously in connection with FIGS. 4 and 8. However the bombardment is effected for a shorter time so that the etching occurs through only part of the thickness of the body 21. As a result, there is formed a mesa 31 upstanding on the remainder of the body 21; this mesa 31 of infra-red sensitive material is topped by the remainder of the masking stripe 24, and the remainder of the passivating layer 14 is present between the top of the mesa 31 and the stripe 24. The broken line 26 in FIG. 11 indicates the original passivated surface of the body 21. The ion bombardment also etches to a lesser extent the photoresist stripe 24 and the exposed surface of the substrate 22, but this is not indicated in the drawing for the sake of simplicity.

The Applicants have found that the etch rate of anodic oxide which forms the layer 14 is approximately 1.3 times that of the underlying cadmium mercury telluride, and that there does not occur any significant removal of the layer 14 under the edge of the masking layer 24 during the ion-beam etching; this is important since it is desirable for the layer 14 to adjoin at its edges the subsequently provided metal electrodes. Similarly no significant etching occurs of the layer 4 under the edge of the body 21.

The Applicants have found that ion-beam etching permits the mesa 31 to be formed in a reproducible manner with a well-defined shape by uniform removal of cadmium mercury telluride from the unmasked surface parts of the body 21. The cadmium mercury telluride is etched to a uniform depth of at least 0.5 micron and preferably much deeper, for example 2 or 3 microns; the resulting structure permits a significant proportion of the current occurring between the detector electrodes in operation of the final detector element to flow across the bulk of the mesa 31 between its sidewalls rather than adjacent its top surface. The ion-beam etching permits the side-walls of the mesa 31 to be comparatively steep, for example with a slope of 75°. The factors that control the slope include the angle of the beam 27, the shape and etching of the resist 24 and any redeposition of the ejected target atoms.

After forming the mesa 31, metal is deposited to form a layer 33 on the photoresist stripe 24, on parts of the body 21 not masked by the stripe 24, and on the area of the surface of the substrate 22 around the body 21. This metal layer 33 is thus deposited on both the side-walls of the mesa 31 and on the surface of the remainder of the body 21. The resulting structure is illustrated in FIG. 12.

Preferably the metal is deposited by evaporation because chromium is difficult to sputter, and evaporation is a relatively cool, low energy process which does not significantly damage the cadmium mercury telluride. The Applicants have found that metal deposited in this way can have good adhesion to the topographically rough surfaces produced by the ion-beam etching on both the cadmium mercury telluride body 21 and the sapphire substrate 22. However it is of course possible to deposit the metal in other ways, for example by sputtering. The Applicants have found it is advantageous for the metal to consist of a first layer of chromium deposited in contact with the infra-red sensitive material (because of the strong adhesion of chromium to both cadmium mercury telluride and sapphire) and a thicker second layer of gold deposited on the chromium layer to reduce the electrical resistance of the metal film; chromium has both a thermal expansion coefficient and a work function compatible to that of cadmium mercury telluride and does not form an amalgam with either mercury or gold at temperatures below approximately 150° C. Such an evaporated gold-chromium layer 33 can have a particularly strong adhesion to both the body 21 and the substrate 22. The chromium may be for example 0.05 micron thick, and the gold may be for example 0.5 micron thick.

Figure 13:
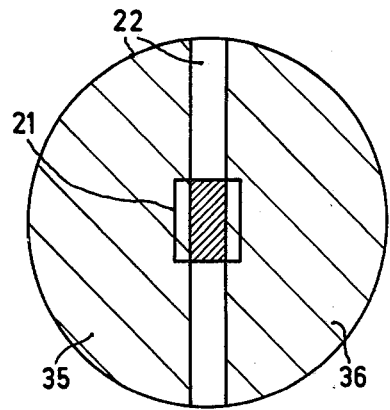
FIG. 13 is a plan view of the arrangement of FIG. 12 after removal of the first masking layer.

The masking layer 24 is then removed to lift away the metal thereon and to leave the remainder of the layer 33 as a metallization pattern 35, 36 on both the body 21 and the substrate 22, as illustrated in FIG. 13. Since the layer 24 is of photoresist it can be removed by immersing in acetone and possibly using agitation to aid the removal in known manner. The remaining metallization pattern consists of two separate parts 35 and 36, each of which extends on the side-walls of the mesa 31 and will be further processed subsequently to form separate detector electrodes contacting these side-walls of the detector elements.

This further processing involves masking and etching the body 21 and the metallization pattern 35, 36 to divide them into a desired pattern of detector elements and their electrodes. For this purpose a second masking layer 44 is provided on most of the metallization pattern 35, 36 and most of the body 21 where not covered by the pattern 35, 36. This layer 44 may also be formed of photoresist such as for example Shipley resist AZ 1350H and has a plurality of windows 45, 46 and 48 which are formed by selective exposure and development of the photoresist.

Figure 14:
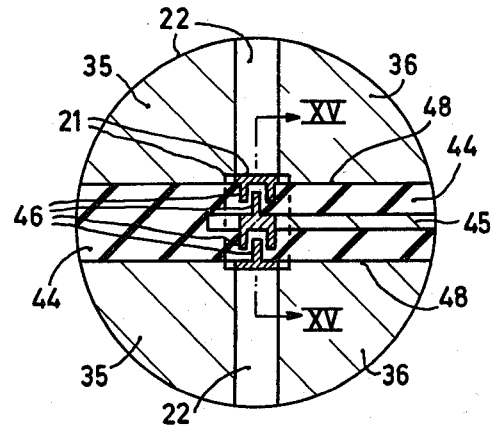
FIG. 14 is a plan view of the arrangement of FIG. 13 after providing a second masking layer for determining the desired pattern of detector elements and their electrodes.

As shown in FIG. 14 the stripe-shaped window 45 extends in a direction perpendicular to that along which the earlier stipe 24 extended. This window 45 defines where the body 21 and the metallization part 36 will each be divided into two parts, one for each of the two detector elements to be formed. The width of the window 45 may be for example 10 microns. The outer two windows 48 define a side-wall of each of the elements at opposite ends of the body 21.

Figure 16:
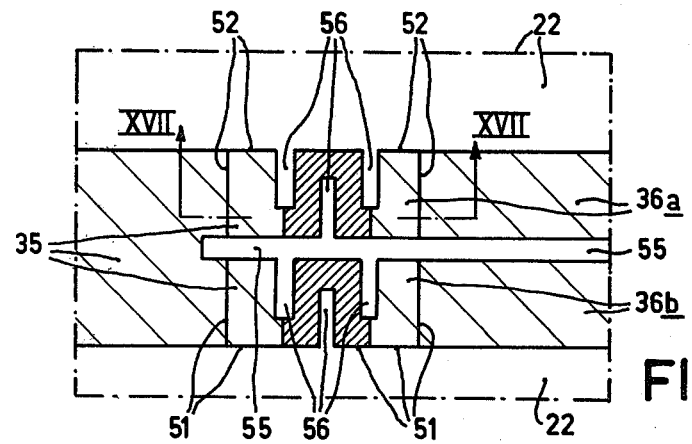
FIG. 16 is an enlarged plan view of part of the resulting detector element array which is in accordance with the invention.

The six substantially parallel windows 46 extend perpendicularly from the windows 45 and 48 so as to form an interdigitated window pattern over the parts of the body 21 where the infra-red sensitive active areas of each detector element are to be formed. These windows 46 define those parts of the material which are to be removed by the etching over the whole thickness of the body 21 so as to form interdigitated slots 56 which (as shown in FIG. 16) extend from opposite side walls of each resulting detector element across a major part of the width of each element. As a result of these interdigitated slots each element has a meandering current path formed between its electrodes as will be described hereinafter. The widths of the windows 46 in the masking layer 44 may be for example 7.5 microns.

The parts of the body 21 and the metallization pattern 35, 36 at these windows 45, 46 and 48 are now removed from the substrate 22. This removal is effected by etching with a beam 47 of argon ions in a manner similar to that described with reference to FIG. 8. The etching is effected throughout the thickness of the body 21 and throughout the thickness of the layer pattern 35, 36 while using the masking layer 44 as an etchant mask.

The steep side-walls produced by ion-beam etching of the cadmium mercury telluride and the only very small lateral etching which occurs permit both a close separation 55 between the resulting elements 51 and 52 and the formation of very narrow slots 56 which extend from opposite side walls of the elements to form the meandering current path. The separation 55 may be for example 10 microns, and the width of the slots 56 may be for example 7.5 microns. This is a considerable advantage over the use of chemically reactive etchant solutions for such etching.

The argon ions etch away the exposed parts of the body 21 including the corresponding parts of its anodic surface layers 14 and 4 without significant lateral etching of these layers 14 and 4 under the edges of the masking layer 44 and the resulting elements respectively. The argon ions also etch away the exposed metallization in the same etching step. The etching is continued for a sufficiently long time to etch through the parts of the body 21 where covered by exposed parts of the metallization pattern 35, 36. This etching of body parts under exposed metallization parts occurs at the slots 45 and at the outer slots 46 where the material is removed from adjacent the contact areas of the electrode metallization 35 and 36.

Figure 17:
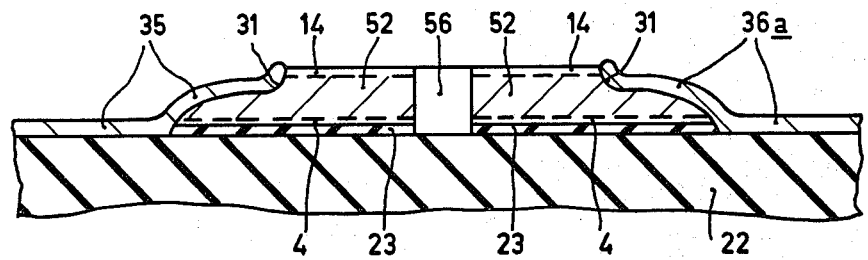
FIG. 17 is a cross-sectional view taken on the line XVII—XVII of FIG. 16.

After removing the second masking layer 44, the resulting detector arrangement is as shown in FIGS. 16 and 17. The group of two detector elements 51 and 52 so formed have a common electrode 35 on one side and on the opposite side individual electrodes 36a and 36b formed from part 36 of the metallization pattern 35, 36. Each of these detector elements comprises an active area in the form of a mesa 31 of the infra-red sensitive material with the separate, sunken metal electrodes 35 and for example 36a on the opposite side-walls of the mesa 31, as illustrated for detector element 52 in FIG. 17. Although such mesa contacting is not essential in a method in accordance with the present invention, it can lead to significant performance benefits for the detector; this technique is described and claimed in one of our co-pending Patent Applications PHB 32631 filed on the same day as the present Application and the contents of the Specification of which are hereby incorporated by reference into the present Specification.

Because of both the separation 55 between the elements 51 and 52 and the slots 56 which extend into them are narrow, the area which they occupy is small which is important as this is a non-sensitive area of the detector. Because of the slots 56, the current path meanders between the electrodes of each element 51 and 52 and adjoins both the electrode contact areas of each element over only part of the width of the whole active area of the element. This current path is therefore longer than the distance along a straight line between the areas contacted by the electrodes of that element. This increases the charge-carrier transit time and the resistance between the electrodes and so can improve the responsivity of each of the detector elements while still producing a compact detector structure. By including slots 56 in this manner, the Applicants have increased by a factor of between 3 and 4 the responsivity of a detector element having a sensitive area of 50 microns by 50 microns.

The fabrication process described with reference to FIGS. 9 to 17 requires only two masking steps. The first mask 24 determines a metallization pattern and its alignment is not critical. The second mask 44 determines the desired pattern of elements and their electrodes which are formed from the body 21 and the metallization pattern respectively. Such a process is described and claimed in our PHB 32630 Patent Application which is filed on the same day as the present Application and to which reference is invited; it has an advantage in not requiring a critical alignment of separate masking steps, one for dividing the body 21 into elements and another for defining the electrode pattern, in spite of the very small spacing between adjacent elements of the array.

External connections can be made to the elements of the array by bonding wires to the parts of the electrodes 35, 36a and 36b where they are present directly on the substrate 22 so as not to damage the infra-red sensitive material of the elements 51 and 52.

Many modifications are possible within the scope of the present invention.

By forming a body 21 of different size and/or by using a different pattern for the first masking layer 24 and/or the second masking layer 44, different groups of detector elements can be formed on the substrate 22. Such groups may be for example linear arrays of more than two elements, back-to-back linear arrays which together form a two-dimensional area array, and for example staggered arrays of detector elements.

Figure 18:
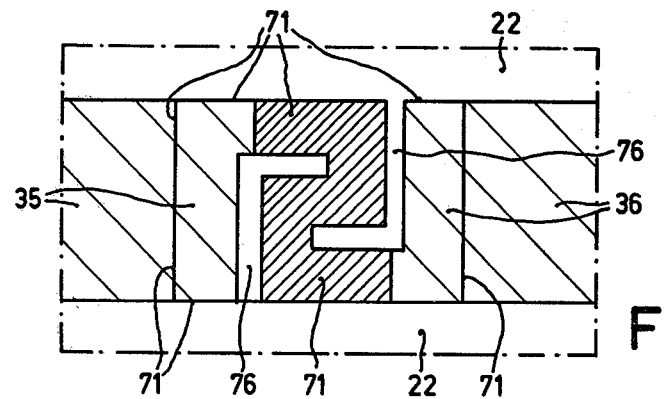
FIG. 18 is a modification of FIG. 16 showing in plan view a detector element in accordance with the invention and manufactured by a slightly different method also in accordance with the invention.

Instead of dividing the strip portions 9 shown in FIG. 8 into bodies 21 or sufficient size to form a plurality of detector elements, the strip portions 9 may be divided into bodies 21 for forming a single detector element. After securing such a body to an insulating substrate 22, it may be provided with a first masking layer such as the stripe 24 in FIG. 10, ion-beam etched, and then provided with a metallization pattern similar to the pattern 35, 36 of FIG. 13 by metal deposition and mask removal. In this case, the metallization pattern thus formed may be identical to the final electrode pattern because it does not need to be formed into separate electrodes for separate detector elements. The body, substrate and metallization pattern are then masked with a second masking layer which need only have windows determining where parts of the body 21 are to be removed by ion-beam etching from the substrate 22 to define a meandering current path between the element electrodes. FIG. 18 is an example of a detector element 71 manufactured in this manner and having electrodes 35 and 36. In this embodiment the slots 76 defining the current path could have had the same form as the slots 56 of each element shown in FIG. 16. However FIG. 18 illustrates a modified form of the slots which is applicable also to the FIGS. 16 and 17 embodiment; as shown in FIG. 18, there are only two slots 76 and each of them extends into the element body from an opposite side wall and then turns through 90° to extend parallel to the length of the element 71. It should be evident that many other slot structures are possible for forming a meandering current path between the electrodes, and that the number of meanders which the current path makes can be increased by increasing the number of slots 56 or 76 which extend from the side walls of the detector elements.

Figure 19:
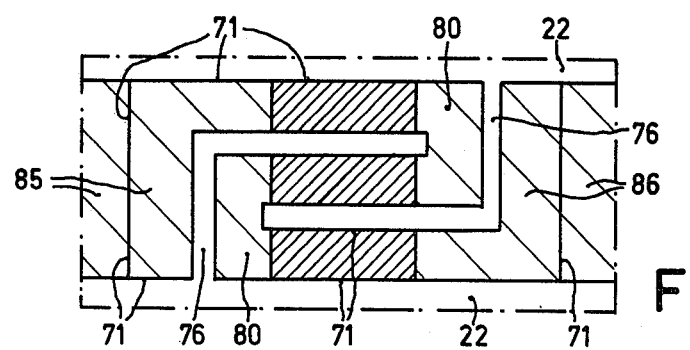
FIG. 19 is a modification of FIG. 18 showing in plan view a detector element in accordance with the invention and manufactured by a slightly different method also in accordance with the invention.

FIG. 19 illustrates a modification of the FIG. 18 structure, in which the L-shape slots 76 formed by the ion-etching extend into the element body to divide the metallization pattern into end electrodes 85 and 86 and intermediate sunken electrodes 80 which extend across intermediate parts of the current path. The same method steps in accordance with the invention are used, but with elongation and displacement of the L-shape windows in the mask for the ion-etching definition of the meandering current path. As before, the increased resistance reduces the responsivity loss.

Figure 15:
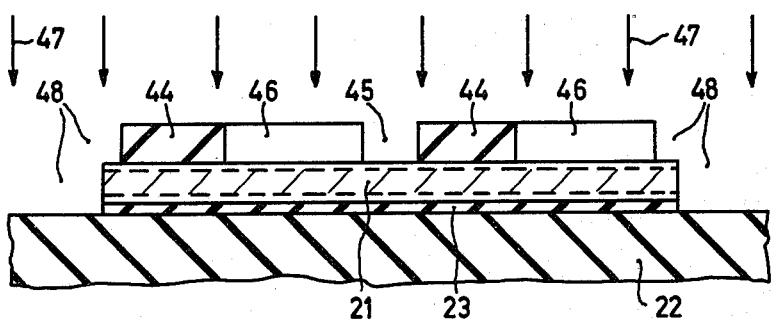
FIG. 15 is a cross-sectional view of the arrangement of FIG. 14 during an ion-beam etching step to form said desired pattern.

The ion-beam etching illustrated in FIG. 15 forms exposed surfaces of the detector elements at both the slots 56 and the separation 55. These surfaces can be passivated by subsequently forming a passivating layer in known manner, although it appears to the Applicants that the ion-beam etched surfaces already have some intrinsic passivation, perhaps as a result of implantation of the inert ions at the surface. Instead of forming a passivating layer 14 on the upper surface of the detector elements before metallization and element definition, the sensitive active areas of the elements and their sides can be passivated by a subsequent treatment.

The Applicants have found that ion-beam etching (especially with at least part of the ion beam neutralized with electrons) has proved to be a particularly reproducible etching process for infra-red sensitive materials such as cadmium mercury telluride, while avoiding serious damage to the material. However instead of ion-beam etching, other equivalent forms of ion-etching may be used, for example so-called "magnetron sputtering" in which the ion flux used for sputter-etching is concentrated by a magnetic field. Magnetron sputtering is described in for example the article entitled "Equipment for sputtering" by A. J. Aronson, Solid State Technology, December 1978, pages 66 to 72, although this article is primarily concerned with sputter-deposition rather than sputter-etching. Other ion-etching processes are described in the articles "An Investigation of Ion-Etching" by H. Dimigen et al., Philips Technical Review, Vol. 35, No. 7/8, pages 199 to 208, and "Introduction to Ion and Plasma Etching" by S. Somekh, Journal of Vacuum Science Technology, Vol. 13, No. 5, pages 1003 to 1007.

Instead of forming the detector elements of cadmium mercury telluride, other infra-red sensitive materials may be employed, for example other ternary intermetallic chalcogenides such as for example lead tin telluride or other monocrystalline semiconductors such as for example lead sulphide or indium antimonide.

In the embodiments described hereinbefore the methods comprise the application of ohmic contact electrodes to element bodies having a uniform material composition and for use in detectors of which the operation is based on intrinsic photoconductivity. However also within the scope of the present invention is the manufacture of detector elements each of which has a p-n junction located on the sensitive mesa area of the element body; in this case the element has electrodes which extend on the side-walls of the mesa and make ohmic contact to the p-type and n-type regions respectively of the body.

It will also be evident that other metals than gold and chromium may be used to form the electrodes, for example aluminium or silver, and that the detector substrate may be of material other than sapphire. Thus, for example the insulating substrate 22 may be of for example alumina, silicon or beryllia.

What is claimed is:

1. A method of manufacturing a detector element for infra-red radiation, which element comprises infra-red sensitive material having an active area and two parallel electrodes each disposed on a contact area of the infra-red sensitive material so that the active area lies between the electrodes, comprising the steps of:
    (a) securing a body of infra-red sensitive material to a substrate;
    (b) thereafter providing a masking layer on the body, the masking layer having elongate windows between areas on the body where the two contact areas are to be or are formed, the elongate windows exposing stripe-shaped parts of the body which extend at least transverse to the direction between the two contact areas; and
    (c) ion-etching the material through the elongate windows in the masking layer, over the whole thickness of the body, to form substantially parallel slots in the active area which extend from opposite side-walls of the detector element across part of the width of the active area to define a meandering current path in the active area between the two contact areas, which current path extends through the infra-red sensitive material remaining in said active area and is longer than the distance along a straight line between the two contact areas.

2. A method as claimed in claim 1, further comprising the steps of first providing a passivating layer at least on the surface of the body between the contact areas, then providing the masking layer and then ion-etching to remove parts of the passivating layer before removing the underlying material over the whole thickness of the body.

3. A method as claimed in claim 2 wherein the width of the slots is at most equal to the thickness of the body.

4. An infra-red detector manufactured by the method claimed in claim 3.

5. A method as claimed in claim 2 wherein the width of the slots is at most 10 microns.

6. A method as claimed in claim 5 wherein the masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

7. A method as claimed in claim 6 wherein the step of ion-etching divides the electrode metallization to form both an electrode at one end of the meandering current path and an intermediate electrode on the current path.

8. An infra-red detector element manufactured by the method claimed in claim 7.

9. An infra-red detector manufactured by the method claimed in claim 6.

10. A method as claimed in claim 5 wherein the step of ion-etching over the whole thickness of the body includes forming a separation between parts of the body so that each portion forms a separate infra-red detector element having its own contact areas and electrodes.

11. A method as claimed in claim 5 wherein the step of ion-etching divides the electrode metallization to form both an electrode at one end of the meandering current path and an intermediate electrode on the current path.

12. An infra-red detector element manufactured by the method claimed in claim 11.

13. An infra-red detector manufactured by the method claimed in claim 5.

14. A method as claimed in claim 1 or claim 2, further comprising the step of providing electrode metallization, at least on the contact areas of the body while leaving at least part of the active area between the contact areas free of metallization, and wherein the ion-etching is effected after providing the electrode metallization so that part of the metallization is removed by the ion-etching.

15. A method as claimed in claim 14 wherein the step of ion-etching divides the electrode metallization to form an electrode at one end of the meandering current path and an intermediate electrode on the current path.

16. An infra-red detector manufactured by the method claimed in claim 15.

17. A method as claimed in claim 14, wherein the electrode metallization extends from the body onto the substrate, and the masking layer has windows which extend from the body to the substrate to define a desired electrode pattern on the substrate and further comprising the step of removing parts of the metallization from the substrate through said windows during the ion etching step.

18. A method as claimed in claim 14 wherein the width of the slots is at most equal to the thickness of the body.

19. An infra-red detector manufactured by the method claimed in claim 18.

20. A method as claimed in claim 14 wherein the width of the slots is at most 10 microns.

21. An infra-red detector manufactured by the method claimed in claim 20.

22. A method as claimed in claim 14 wherein the step of ion-etching over the whole thickness of the body includes forming a slot which extends across part of the width of the active area adjacent at least one contact area.

23. A method as claimed in claim 22 wherein the step of ion-etching over the whole thickness of the body includes forming a separation between parts of the body so that each portion forms a separate infra-red detector element having its own contact areas and electrodes.

24. A method as claimed in claim 22 wherein the step of ion-etching divides the electrode metallization to form both an electrode at one end of the meandering current path and an intermediate electrode on the current path.

25. An infra-red detector manufactured by the method claimed in claim 24.

26. An infra-red detector manufactured by the method claimed in claim 22.

27. A method as claimed in claim 14 wherein said masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

28. An infra-red detector manufactured by the method claimed in claim 27.

29. A method as claimed in claim 14 wherein the step of ion-etching over the whole thickness of the body includes forming a separation between parts of the body so that each portion forms a separate infra-red detector element having its own contact areas and electrodes.

30. An infra-red detector manufactured by the method claimed in claim 14.

31. A method as claimed in claim 1 or claim 2 wherein the step of ion-etching over the whole thickness of the body includes forming a slot which extends across part of the width of the active area adjacent at least one contact area.

32. A method as claimed in claim 31 wherein the width of the slots is at most equal to the thickness of the body.

33. A method as claimed in claim 32 wherein the width of the slots is at most 10 microns.

34. A method as claimed in claim 33 wherein the masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

35. An infra-red detector manufactured by the method claimed in claim 34.

36. A method as claimed in claim 33 wherein the step of ion-etching over the whole thickness of the body includes forming a separation between parts of the body so that each portion forms a separate infra-red detector element having its own contact areas and electrodes.

37. An infra-red detector manufactured by the method claimed in claim 33.

38. A method as claimed in claim 32 wherein the masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

39. An infra-red detector manufactured by the method claimed in claim 38.

40. A method as claimed in claim 32 wherein the step of ion-etching over the whole thickness of the body includes forming a separation between parts of the body so that each portion forms a separate infra-red detector element having its own contact areas and electrodes.

41. An infra-red detector manufactured by the method claimed in claim 32.

42. A method as claimed in claim 31 wherein the width of the slots is at most 10 microns.

43. A method as claimed in claim 42 wherein the masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

44. An infra-red detector manufactured by the method claimed in claim 43.

45. A method as claimed in claim 42 wherein the step of ion-etching over the whole thickness of the body includes forming a separation between parts of the body so that each portion forms a separate infra-red detector element having its own contact areas and electrodes.

46. An infra-red detector manufactured by the method claimed in claim 42.

47. A method as claimed in claim 31, further comprising the step of ion-etching through an L-shaped window in the masking layer adjacent each of said two contact areas to form slots, each slot having a first portion which is adjacent said contact area and extends from a side-wall of the detector element and a second portion which extends transverse to the first portion in a direction away from the contact area.

48. A method as claimed in claim 47, further comprising the step of providing electrode metallization at least on the contact areas of the body while leaving at least part of the active area between the contact areas free of the metallization, wherein at least one of the L-shaped windows exposes a part of the metallization and wherein said ion-etching is effected after providing the metallization so that the ion-etching removes said part of the metallization together with the underlying part of the body.

49. A method as claimed in claim 48 wherein the step of ion-etching divides the electrode metallization to form both an electrode at one end of the meandering current path and an intermediate electrode on the current path.

50. An infra-red detector manufactured by the method claimed in claim 49.

51. A method as claimed in claim 31 wherein the masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

52. An infra-red detector manufactured by the method claimed in claim 51.

53. A method as claimed in claim 31 wherein the step of ion-etching over the whole thickness of the body includes forming a separation between parts of the body so that each portion forms a separate infra-red detector element having its own contact areas and electrodes.

54. An infra-red detector manufactured by the method claimed in claim 31.

55. A method as claimed in claim 1 or claim 2 wherein the masking layer comprises at least one further window which extends parallel to the direction between the two contact areas and from which the elongate windows extend transversely, and wherein the ion-etching forms a separation between portions of the body at the further window so that each portion forms a separate infra-red detector element having a meandering current path between its contact areas and electrodes.

56. An infra-red detector manufactured by the method claimed in claim 55.

57. A method as claimed in claim 1 or claim 2 wherein the ion-etching is effected using an ion-beam.

58. An infra-red detector manufactured by the method claimed in claim 57.

59. An infra-red detector element manufactured by the method claimed in claim 1 or claim 2.

60. A method as claimed in claim 1 wherein the width of the slots is at most equal to the thickness of the body.

61. A method as claimed in claim 60 wherein the width of the slots is at most 10 microns.

62. A method as claimed in claim 61 wherein the masking layer comprises at least one further window which extends parallel to the direction between the two contact areas and from which the elongate windows extend transversely, and wherein the ion-etching forms at the further window a separation between portions of the body so that each portion form a separate infra-red detector element having a meandering current path between its contact areas and electrodes.

63. An infra-red detector manufactured by the method claimed in claim 62.

64. A method as claimed in claim 61 wherein the step of ion-etching over the whole thickness of the body includes forming a separation between parts of the body so that each portion forms a separate infra-red detector element having its own contact areas and electrodes.

65. A method as claimed in claim 64 wherein the step of ion-etching divides the electrode metallization to form both an electrode at one end of the meandering current path and an intermediate electrode on the current path.

66. An infra-red detector element manufactured by the method claimed in claim 65.

67. An infra-red detector manufactured by the method claimed in claim 64.

68. A method as claimed in claim 60 wherein the masking layer comprises at least one further window which extends parallel to the direction between the two contact areas and from which the elongate windows extend transversely, and wherein the ion-etching forms at the further window a separation between portions of the body so that each portion forms a separate infra-red detector element having a meandering current path between its contact areas and electrodes.

69. A method as claimed in claim 68 wherein the step of ion-etching divides the electrode metallization to form both an electrode at one end of the meandering current path and an intermediate electrode on the current path.

70. A infra-red detector manufactured by the method claimed in claim 68.

71. A method as claimed in claim 60 wherein the step of ion-etching over the whole thickness of the body includes forming a separation between parts of the body so that each portion forms a separate infra-red detector element having its own contact areas and electrodes.

72. An infra-red detector manufactured by the method claimed in claim 60.

73. A method as claimed in claim 60 wherein the step of ion-etching divides the electrode metallization to form both an electrode at one end of the meandering current path and an intermediate electrode on the current path.

74. A method as claimed in claim 1 wherein the width of the slots is at most 10 microns.

75. An infra-red detector manufactured by the method claimed in claim 74.

* * * * *